US010969693B2

(12) United States Patent
Humbach et al.

(10) Patent No.: US 10,969,693 B2
(45) Date of Patent: Apr. 6, 2021

(54) PRODUCING LIGHT-EXPOSED STRUCTURES ON A WORKPIECE (71) Applicant: Temicon GmbH, Dortmund (DE)

(72) Inventors: Oliver Humbach, Dortmund (DE); Thomas Ruhl, Dortmund (DE)

(73) Assignee: Temicon GmbH, Dortmund (DE)

( * ) Notice: Subject to any disclaimer, the term of this patent is extended or adjusted under 35 U.S.C. 154(b) by 0 days.

(21) Appl. No.: 16/628,907

(22) PCT Filed: Jul. 4, 2018

(86) PCT No.: PCT/EP2018/068146
§ 371 (c)(1),
(2) Date: Jan. 6, 2020

(87) PCT Pub. No.: WO2019/008067
PCT Pub. Date: Jan. 10, 2019

(65) Prior Publication Data
US 2020/0233313 A1 Jul. 23, 2020

(30) Foreign Application Priority Data
Jul. 6, 2017 (DE) .................... 10 2017 115 169.9

(51) Int. Cl.
*G03F 7/20* (2006.01)
*G02B 5/18* (2006.01)
(52) U.S. Cl.
CPC .......... *G03F 7/70158* (2013.01); *G03F 7/201* (2013.01); *G02B 5/18* (2013.01)
(58) Field of Classification Search
CPC ........ G03F 7/70158; G03F 7/201; G03F 1/50; G03F 7/24; G03F 7/70408; G03F 7/70475; G02B 5/18
See application file for complete search history.

(56) References Cited

U.S. PATENT DOCUMENTS 4,013,465 A   3/1977  Clapham
4,935,334 A   6/1990  Boettiger
(Continued)

FOREIGN PATENT DOCUMENTS

DE   3879471 T2   9/1993
DE   4333620 A1   4/1995
(Continued)

OTHER PUBLICATIONS

International Search Report for Application No. PCT/EP2018/068146, with English translation, dated Oct. 18, 2018 (5 pages).
(Continued)

*Primary Examiner* — Deoram Persaud
(74) *Attorney, Agent, or Firm* — Nixon Peabody LLP (57) ABSTRACT

A device and method for producing light-exposed structures on a workpiece having a light-sensitive surface. An optical unit includes a light source and a diffraction grating for producing a strip-shaped illumination pattern having strips extending in a longitudinal direction and having a pattern width extending transversely. A device moves the surface of the workpiece and optical unit relative to each other according to a path sequence, which includes movement longitudinal paths to produce a first and second light-exposed structure having strips, which is oriented parallel to each other on the workpiece surface. The movement paths are mutually spaced apart by less than the pattern width and the light-exposed structures overlap in such a way that strips of the light-exposed structures lie on each other. To obtain good light exposure of the surface by the illumination pattern, the diffraction grating is set oblique to the surface of the workpiece that is light-exposed by the illumination pattern.

14 Claims, 8 Drawing Sheets

(56) References Cited

U.S. PATENT DOCUMENTS

| | | | |
|---|---|---|---|
| 5,620,814 A | 4/1997 | Ernst-Bernhard | |
| 6,882,477 B1 | 4/2005 | Schattenburg | |
| 8,374,067 B2* | 2/2013 | Usami | G03H 1/02 |
| | | | 369/103 |
| 8,685,628 B2* | 4/2014 | Raub | G02B 6/1225 |
| | | | 430/321 |
| 8,841,046 B2 | 9/2014 | Solak | |
| 9,152,040 B1* | 10/2015 | Brueck | G03F 7/2022 |
| 9,174,385 B2* | 11/2015 | Simon | B23K 26/0648 |
| 9,195,146 B2* | 11/2015 | Xu | G01B 11/26 |
| 10,101,652 B2* | 10/2018 | Yajima | G03F 7/70408 |
| 2005/0094152 A1 | 5/2005 | Allen | |
| 2006/0082852 A1* | 4/2006 | Wine | G02B 26/085 |
| | | | 359/201.1 |
| 2007/0023692 A1* | 2/2007 | Stenger | G03F 9/7088 |
| | | | 250/492.2 |
| 2009/0257039 A1* | 10/2009 | Kishikawa | G03B 27/72 |
| | | | 355/70 |
| 2011/0199662 A1* | 8/2011 | Yasuda | B41J 2/451 |
| | | | 359/19 |
| 2012/0194753 A1* | 8/2012 | Shin | G02F 1/133788 |
| | | | 349/33 |
| 2013/0323651 A1 | 12/2013 | Solak | |
| 2016/0182897 A1* | 6/2016 | Asai | H04N 13/31 |
| | | | 348/51 |

FOREIGN PATENT DOCUMENTS

| | | |
|---|---|---|
| DE | 112004002073 T5 | 3/2008 |
| WO | WO 2010/080378 A1 | 7/2010 |

OTHER PUBLICATIONS

Written Opinion of International Searching Authority for Application No. PCT/EP2018/068146, with English translation, dated Oct. 18, 2018 (15 pages).

Gaté, V. et al.; "Fast dynamic interferometric lithography for large submicrometric period diffraction gratings production"; Optical Engineering, vol. 52(9), 091712; Sep. 2013 (8 pages).

Niggemann, M. et al.; "Periodic microstructures for large area applications generated by holography"; Fraunhofer Institute for Solar Energy Systems (ISE), Oltmannstr. 5, Freiburg, Germany; publication date unknown (8 pages).

* cited by examiner

PRODUCING LIGHT-EXPOSED STRUCTURES ON A WORKPIECE

CROSS-REFERENCE TO RELATED APPLICATIONS

This application is a U.S. National Stage of International Application No. PCT/EP2018/068146, filed Jul. 4, 2018, which claims the benefit of Germany Patent Application No. 10 2017 115 169.9, filed Jul. 6, 2017, both of which are incorporated herein by reference in their entireties.

The invention relates to a device and to a method for producing light-exposed structures on a workpiece having a light-sensitive surface.

The production of light-exposed structures can in particular be used to produce surface profiles.

For example, DE 43 33 620 A1 discloses an arrangement and a method for generating dose profiles for producing surface profiles, in particular for microlenses. A shaped radiated spot generates a profiled shape in a constant, straight-line movement after developing a resist applied to the surface. The shaped beam is moved in at least one coordinate relative to the object such that it passes over the surface of the object in a timed manner, and in so doing, the surface obtains a locally varying radiation dose. An aperture can be used to shape the beam of a beam source, for example a light source, x-ray beam source, electron source or ion source. To produce microlenses, parabolic beam shapes are preferably used, and beam shapes with a Fresnel structure.

In U.S. Pat. No. 6,882,477 B1, SBIL (scanning beam interference lithography) is described, wherein a substrate is moved on a stage under overlapping and interfering pairs of coherent beams. The formed interference pattern forms a "paintbrush" with which periodic and quasi periodic patterns are written on the substrate. The phase of the interference pattern is phase-locked with the movement of the stage.

In "Fast dynamic interferometric lithography for large submicrometric period diffraction gratings production" by Gâté et al, Optical Engineering 52 (9), 091712 (September 2013), large periodic gratings are written with a laser. The writing head consists of a phase mask with which a diffraction pattern is projected onto a substrate coated with photoresist. By continuously moving the substrate, one or two-dimensional gratings can be generated on large surfaces.

It can be considered an object of the invention to propose a device and a method with which relatively fine structures can also be generated on large surfaces with high quality.

According to the invention, the object is achieved by a device according to claim 1 and a method according to claim 14. Dependent claims refer to advantageous embodiments of the invention.

In the method according to the invention and the device according to the invention, light-exposed structures are generated on the surface of a workpiece in each case. The surface of the workpiece is light-sensitive, for example from a light-sensitive layer such as a photoresist. In this case, different shapes of workpieces and associated surfaces can be light-exposed, for example flat surfaces or curved surfaces. In particular, the surface can be a cylindrical surface.

According to the invention, a strip-shaped illumination pattern is generated by illuminating a flat diffraction grating, preferably an amplitude grating, with a light source. In particular, a coherent light source is preferred as a light source, in particular a laser light source. The diffraction grating illuminated thereby can for example be a line grating that has linear, transparent regions running in the longitudinal direction. Preferably, a line grating mask has a high number of lines with a regular structure, that is, the same line width and same distances. The structural period of preferred line grating masks can for example lie within a range of 100 nm to several micrometers, preferably within a range of 200 nm to 1 µm. The mask can for example be rectangular or square with typical edge lengths within a range of for example 10 to 400 mm.

The light from the light source is preferably directed with a specific intensity distribution onto the diffraction grating, for example by an optical system with one or more lenses and/or prisms. The arrangement can be selected so that an e.g. Gaussian or trapezoidal intensity distribution results on the surface of the diffraction grating. The illuminated spot can for example be round in this case, i.e., have at least substantially equivalent dimensions in the longitudinal direction parallel to the lines of the illumination pattern (hereinafter also termed the X direction) as well as in the transverse direction running transversely thereto (hereinafter the Y direction). In practice, the illuminated spot is not sharp-edged but corresponds to a generally gradual intensity curve (such as a Gaussian curve) so that, for example, a line can be considered an extension of the illuminated spot in which the intensity is reduced by a fixed ratio in relation to the maximum. Preferably a value of 0.00034% is considered as the fixed ratio (which would correspond to a value of 6σ in a Gaussian distribution). In this case, deviating extensions of the illuminated spot in the two directions in space are preferred, for example an elliptical or strip-shaped intensity distribution. Preferably, the illuminated spot has a smaller extension in the longitudinal direction (X direction) than in the transverse direction (Y direction); preferably, the extension in the Y direction corresponds to at least 3 times, particularly preferably even at least 10 times that of the extension in the X direction. The greatest possible extension in the Y direction results in a large pattern width so that a large surface is traversed in movement in the X direction. A smallest possible extension in the X direction only results in a slight influence on the light-exposed structure in the event that the arrangement of the strip pattern is not entirely parallel with the travel path in the X direction, whereas a deviation from the parallel arrangement has greater effects when the X extension is greater.

In another preferred arrangement, the extension of the illuminated spot does not extend to the edge of the diffraction grating in order to avoid optical edge effects if possible. The illuminated spot, again measured according to the aforementioned 6σ criterion, has a smaller width than the diffraction grating at least in the transverse direction Y (and preferably also in the longitudinal direction X); particularly preferably, the diffraction grating is at least 30% larger or even at least twice as large.

By using the diffraction grating, a strip-shaped diffraction pattern is generated, preferably as a diffraction or interference pattern. This arises when the wavelength of the light lies within the scale of the grating period of the mask, or is smaller. For example, the ratio of the wavelength λ of the light to the grating period can be 0.1 to 1, preferably 0.8 to 1. Behind the diffraction grating, an interference pattern then forms that has twice the period, or respectively a grating structure of a line grating. The interference field is several micrometers deep and consists of a sequence of equidistant intensity maxima and intermediately arranged intensity minima.

The surface of the workpiece is illuminated with the strip-shaped illumination pattern produced in this manner. This is preferably arranged at a slight distance of about 1 µm to 150 µm behind the diffraction grating. Preferably, the distance between the diffraction grating and the workpiece surface is selected depending on the light-exposure wavelength, for example within a range of 20 to 300 times the wavelength.

The strip-shaped illumination pattern has a pattern width in the transverse direction (Y direction). In this case, it normally has an intensity distribution in which the maxima (strips) decrease in the transverse direction from the middle toward the edges. Whereas components of the illumination pattern can extend further with less intensity in the transverse direction, preferably the width is considered the pattern width in which the intensity of the maxima has decreased to 0.00034% (6σ) of the central primary maximum at the edges.

According to the invention, the optical unit which generates the strip-shaped illumination pattern is moved along a path sequence relative to the surface of the workpiece. This can be achieved by moving the optical unit with a fixed workpiece, or by moving the workpiece with a fixed optical unit, for example moving or rotating. Both the workpiece as well as the optical unit can also be moved such that a relative movement results between the two that yields the given path sequence of the illumination pattern on the workpiece surface.

According to the invention, the path sequence comprises at least one first and one second movement path in the longitudinal direction (X direction) in order to generate a first light-exposed strip-shaped structure on the surface of the workpiece, and a second light-exposed strip-shaped structure parallel thereto. In this case, the first and the second movement path are at a distance from each other in the transverse direction. The distance between the first and second movement path is less than the pattern width so that an overlapping region results on the surface of the workpiece, i.e., a region in which light-exposure takes place on both the first as well as the second movement path.

According to the invention, the first and second light-exposed structures generated on the first and second movement path overlap partially so that strips of the two structures are arranged lying on each other, i.e., are in-phase. In the preferred case of periodic structures, the first and second structure are preferably offset from each other by an integral multiple of the pattern period so that the respective strips, or respectively the maxima of the illumination pattern, overlap spatially on the workpiece surface.

The in-phase positioning is preferably effected with high precision so that deviations lie below 20% of the pattern period if possible.

The illumination pattern formed behind the diffraction grating has maxima and minima (Talbot effect) not just in the direction transverse to the optical axis, but also in the Z direction, i.e., along the optical axis. It therefore has a limited depth of field. In order to nonetheless generate light-exposed structures on the surface with a sharp strip pattern, it is provided according to the invention to arrange the diffraction grating obliquely tilted relative to at least part of the light-exposed surface. In this case, the part of the surface can for example be considered that is simultaneously illuminated by the illuminated spot (the limits of which are determined if applicable by the 6σ criterion).

Such an oblique arrangement yields a compensation of the different positions of the maxima in the Z direction in the relative movement of the illumination pattern and the surface in the longitudinal direction (X direction).

The oblique position can be achieved on the one hand by arranging the diffraction grating oblique to the optical axis of the light source. The diffraction grating and the light source (as well as if applicable an intermediately arranged optical system) can then be arranged such that the light of the light source falls on the mask at an angle α to a normal direction N perpendicular to the surface of the mask.

The light source and the diffraction grating can, however, also be oriented in a straight line relative to each other if the surface of the workpiece or at least a part thereof is oriented obliquely to the common optical axis of the light source and the diffraction grating. When an oblique position exists at least in part of the surface of the workpiece light-exposed by the illumination pattern, i.e., a surface normal F of the surface is arranged at an angle β to a normal direction N perpendicular to the surface of the mask, a sharp strip pattern results during subsequent relative movement in the longitudinal direction (X direction).

In this case, a flat surface of the workpiece can for example be arranged obliquely to the flat diffraction grating so that an angle β results at each illuminated point of the surface between the surface normal F and the normal direction N of the diffraction grating.

The effect that the different positions of the maxima in the Z direction are compensated by the relative movement in the longitudinal direction also results when the diffraction grating is arranged obliquely to only part of the simultaneously light-exposed surface, i.e., for example when the surface is curved. Then the surface normals F of the surface at various locations of the illuminated part of the surface are oriented in directions that deviate slightly from each other so that oblique positions result during illumination with the illumination pattern formed by the flat diffraction grating.

For example, the surface can be a cylindrical surface, and the workpiece can be rotated to achieve the relative movement so that the desired effect results.

The tilt angle β between the diffraction grating and the surface of the workpiece, and/or the tilt angle α of the diffraction grating relative to the light source can for example be between 0.02 degrees and 2 degrees. Preferably, the angle can for example be selected depending on the wavelength λ of the employed light and the distance a between the diffraction grating and the workpiece surface such that a sine value of the angle lies within a range of 5 times the ratio of the wavelength to the distance ($5*\lambda/a$) up to 50 times this ratio ($50*\lambda/a$).

An illumination pattern can be generated on the workpiece surface very precisely with the device according to the invention and the method according to the invention.

By means of the optical unit, it is possible to generate very fine patterns, in particular when an illumination pattern is achieved with double periods of the mask grating structure when there are interference patterns. At the same time by overlapping a plurality of movement paths in the X direction and by overlapping the light-exposed structures generated thereby, a relatively large surface can be light-exposed with the desired pattern. In this case, the use is naturally not limited to overlapping the light-exposure of two movement paths; instead, a large area of for example at least 100 cm$^2$, more preferably at least 1000 cm$^2$ up to 1 m$^2$ or more can be light-exposed on the surface of the workpiece by a plurality of movement paths offset in the Y direction.

According to a further embodiment of the invention, a control device can be provided for automatically controlling the moving device according to the path sequence. The path sequence can on the one hand comprise movement paths in the X direction to generate the light-exposure and, on the other hand, offset paths for positioning for subsequent movement paths that at least partly run in the transverse direction. In so doing, the movement paths in the longitudinal direction can always be traveled in the same direction, or alternatively in the opposite direction. The offset paths can run directly in the transverse direction, or alternatively also obliquely. During the offset paths, the optical unit is preferably deactivated so that no interfering light-exposure is generated while moving in the transverse direction. The moving device can for example have a movable carriage for the optical unit that can be positioned in the X direction and/or in the Y direction by suitable actuators. To light-expose the cylinder surfaces, the moving device can comprise a turning device for a cylindrical workpiece in conjunction with a carriage for the optical unit that can be moved in the longitudinal direction of the cylinder.

A very precise in-phase overlapping of the first and second light-exposed structure represents one important aspect of the invention. In order to achieve this, a highly precise controlling of the moving device can be specified when the structure of the pattern, for example the pattern period, is known. This can be accomplished by a positioning device which for example is controlled according to an external reference structure or by means of interferometer measurement that for example can be generated by interference.

According to a further embodiment of the invention, the path sequence is selected so that a light-exposed structure has at least substantially constant light-exposure on the surface of the workpiece, at least in the overlapping region of two movement paths. A light-exposure that is at least substantially constant is understood to mean that the light-exposure dose of the individual strips or respectively maxima deviates with a deviation of not more than 30%, preferably not more 20%, preferably not more than 10% from an average, so that a regular structure results with maxima that are substantially the same level. To achieve this, the offset between the first and second path of travel is preferably selected depending on the illumination pattern so that the overlapping maxima of an interference pattern are the same level in total. A completely regular structure can thus be achieved.

In the event of a regular illumination pattern, in particular the preferred interference pattern, a pattern period corresponds to the spacing of the maxima of the intensity distribution of the illumination pattern on the surface of the workpiece. An offset section within the path sequence between the first and second path of travel is chosen so that the offset in the transverse direction corresponds to an integral multiple of the pattern period with the desired precision so that the desired, precise overlap of the maxima is achievable. The offset section can for example be chosen depending on the intensity distribution of the illumination pattern with the goal of achieving if possible a matching of the light-exposure dose of the individual strips. Offset sections, for example, within a range of at least 10%, preferably at least 25% of the pattern width have proven to be beneficial. To also achieve a sufficient overlap, the offset section should preferably be less than 90% of the pattern width, preferably less than 60% of the pattern width.

Overall, it is preferable for the path sequence to comprise a plurality of parallel movement paths in the longitudinal direction in order to generate a light-exposed overall structure with parallel strips by parallel, overlapping light-exposed structures on the surface of the workpiece.

In this case, structures with intersecting strips can also be generated, for example in that a first light-exposed overall structure is generated by overlapping several strip-shaped light-exposures running in the longitudinal direction, and this first light-exposed overall structure is overlapped with a second light-exposed overall structure that extends in a second longitudinal direction which forms an angle to the first longitudinal direction greater than 0°.

In the following, embodiments of the invention will be further explained with reference to the drawings. In the drawings.

Figure 1:
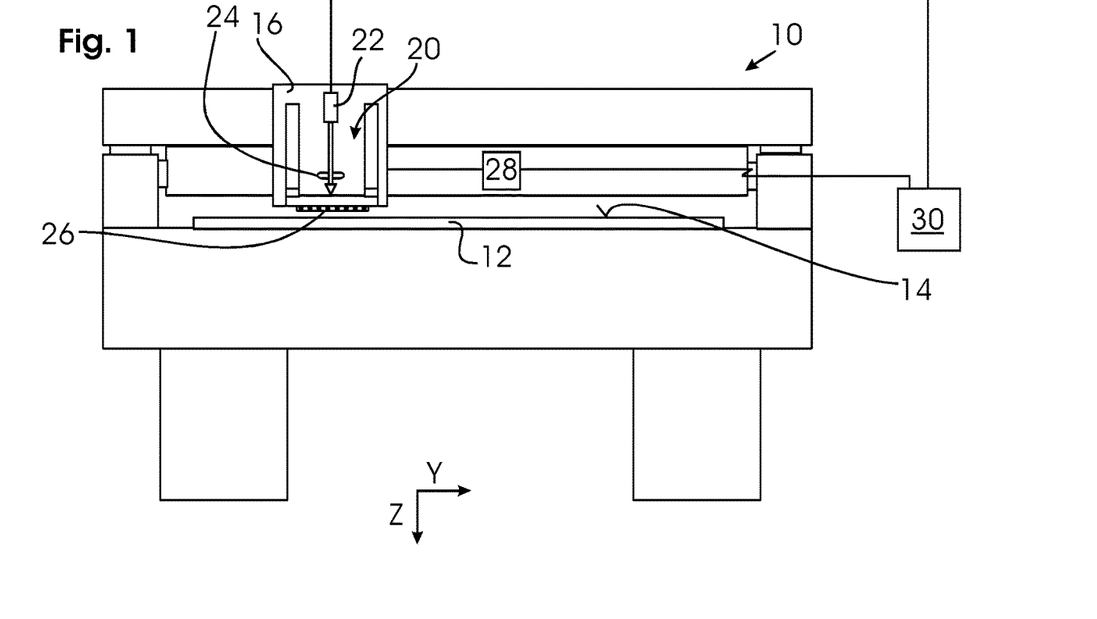
FIG. 1 shows in a schematic side view a device for exposing the surface of a flat workpiece.

FIG. 1 schematically shows a light-exposure device 10 with a table for a flat workpiece 12 with a light-sensitive surface 14 to which a layer consisting of photoresist is applied.

At a slight distance in a Z direction on a movable carriage 16, an optical unit 20 is arranged above the surface 14 with a light source 22, optical system 24 and line grating mask 26 which are only symbolically represented in this case. As explained below, the optical unit generates an illuminated pattern on the surface 14 of the workpiece 12. By means of highly precise actuators 28 that are only schematically represented in FIG. 1, the carriage 16 is moved and positioned in an X direction parallel to the lines of the line grating mask 26, and in a Y direction perpendicular thereto. The carriage 16 in this case is mounted so as to move very easily, for example on an air bearing, and can be moved by suitable linear motors. The positioning device 28 as well as the light source 20 are controlled by a control device 30. For positioning, external reference marks are used, and the carriage is positioned according to the reference marks. The reference marks can be applied for example on glass rods.

Figure 2:
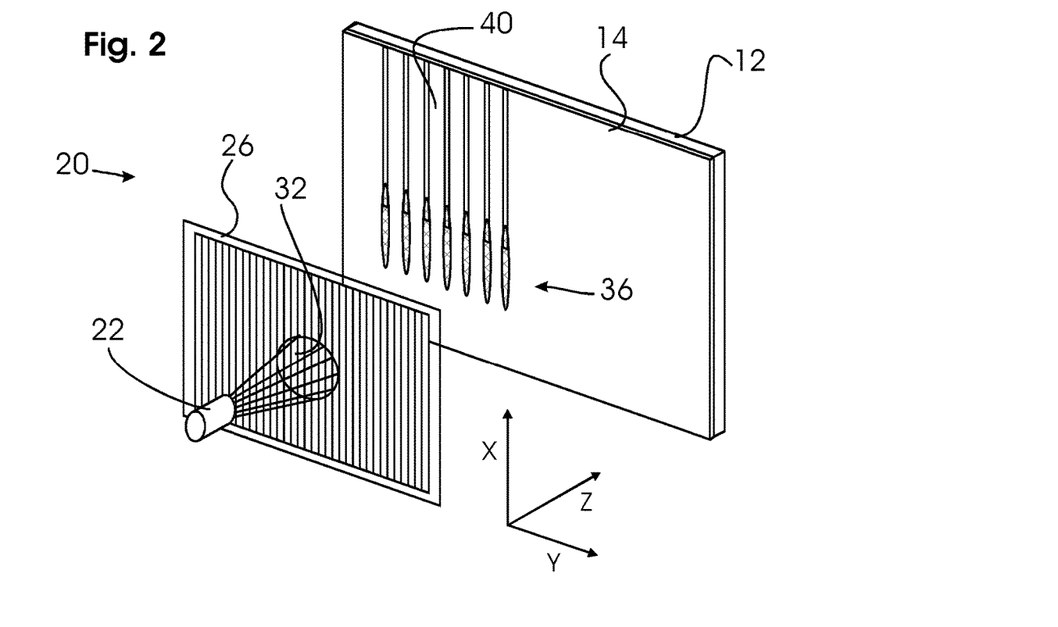
FIG. 2 shows in a schematic perspective representation the arrangement of an optical unit in front of a workpiece.
Figure 3:
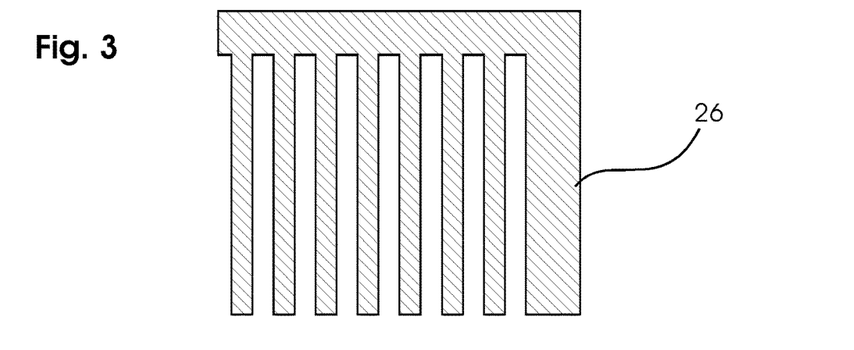
FIG. 3 shows a part of a line grating mask of the optical unit from FIG. 2.
Figure 4:
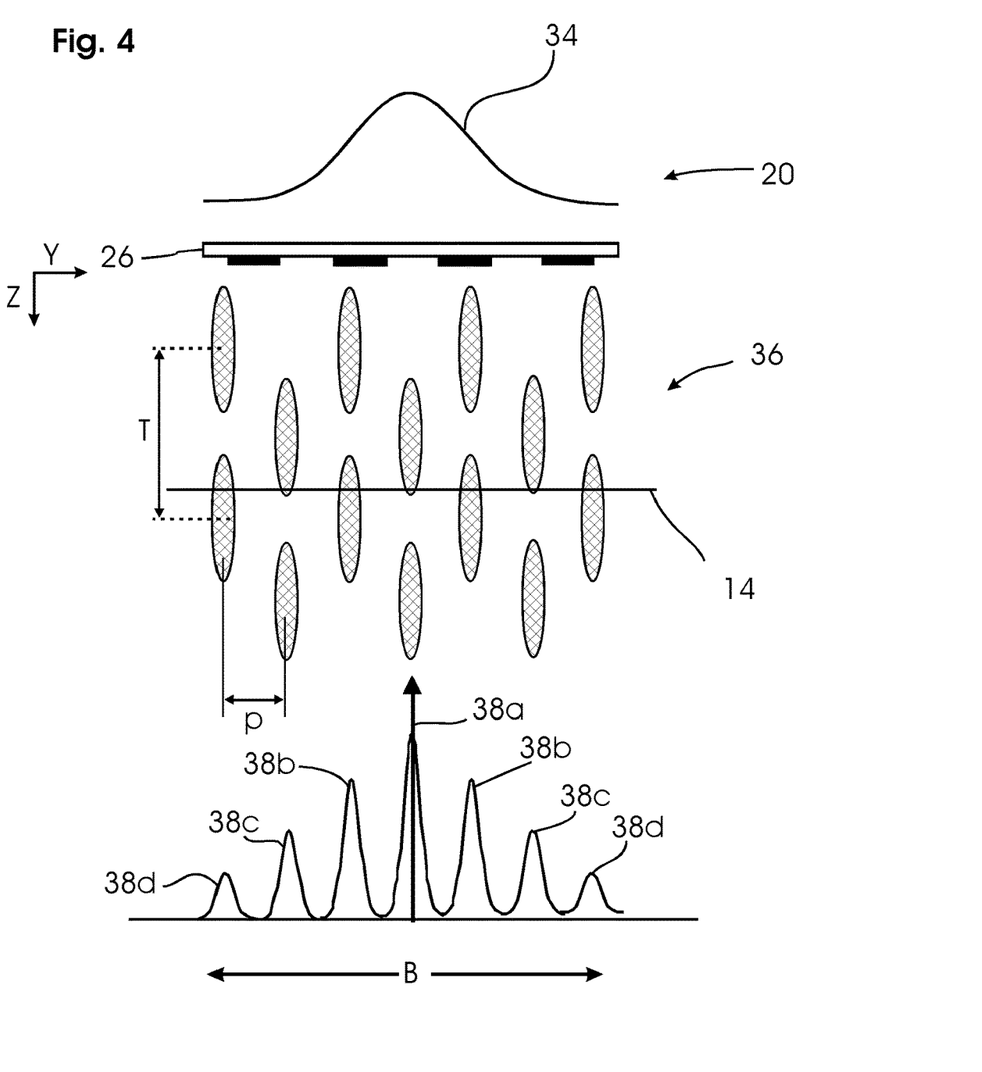
FIG. 4 shows a schematic representation of intensities of the light striking a mask, as well as a resulting interference pattern.

The functioning of the optical unit 20 and the shape of the line grating mask 26 are portrayed more detailed in FIGS. 2 to 4. The line grating mask 26 is rectangular and has a regular line grating of a grating period of for example 200 nm to 1 μm.

The light source 22 generates, possibly with the assistance of the optical system 24, an illuminated spot 32 on the surface of the mask 26. In the shown example, the illuminated spot 32 does not extend to the edge of the mask 26. In FIG. 4, an intensity distribution 34 of the illuminated spot 32 is shown as a Gaussian distribution, for example. The width of the illuminated spot 32 is determined according to a 6σ criterion (decrease in intensity to 0.00034%).

When using a sufficiently coherent light source 22 with a coherence length of for example at least 5 µm, preferably at least 50 µm, and when using a light source 22 with light at a wavelength that is less than the grating period, an interference pattern 36 behind the mask 26 results as schematically represented in FIG. 4. In the Y direction, the interference pattern 36 has a pattern period p which corresponds to twice the grating period of the mask 26.

At the bottom in FIG. 4, an intensity distribution of the interference pattern 36 is indicated in the plane of the surface 14 of the workpiece. As shown therein, the interference pattern 36 comprises a central primary maximum 38a and, equidistant on both sides at a distance from the pattern period p, in each case continuously decreasing secondary maxima 38b, 38c, 38d, etc. The envelope curve over the maxima 38a, 38b, 38c, 38d again corresponds approximately to a Gaussian curve.

A pattern width B can be defined by the aforementioned 6σ criterion by the spacing of those secondary maxima whose intensity has decreased from the primary maximum 38a to 0.00034%.

However, the interference pattern 36 as indicated in FIG. 4 is uneven in the Z direction, i.e., the direction of the optical axis, and has local maxima and minima, which is known as the Talbot effect.

Figure 4A:
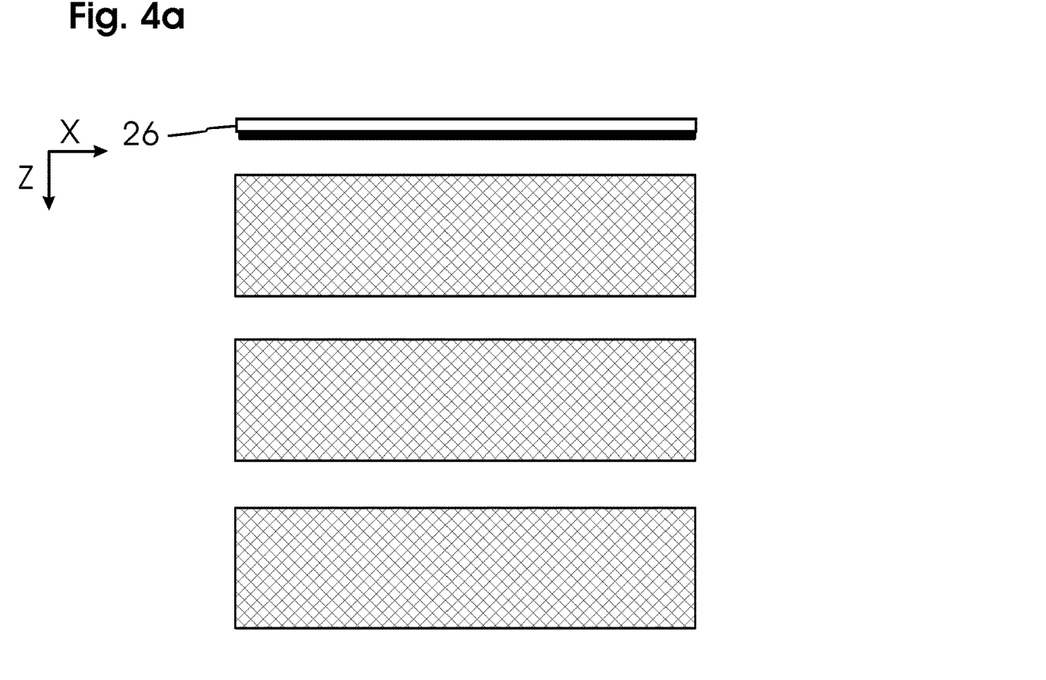
FIG. 4a shows a schematic representation of the interference pattern from FIG. 4 in a side view.

The indicated distribution ("Talbot carpet") results in the Z direction behind the mask 26 with a Talbot period T. The strip pattern generated on the surface 14 within the photoresist layer is therefore also not homogeneous; its intensity distribution substantially depends on the distance of the surface 14 from the mask 26, and therefore has a very low depth of field. As can be seen from the schematic side view in FIG. 4a, strips result that run in the X direction and are spaced in the Z direction.

This problem is counteracted by an oblique tilt of the mask 26 relative to the surface 15 which is explained further below with regard to FIG. 8-10 and FIG. 4b, 4c. However, the mask 26 is only tilted obliquely by a slight angle which cannot be seen in the representations in FIGS. 1, 2 and 4.

As schematically shown in FIG. 2, the light-sensitive surface 14 of the workpiece 12 is illuminated by the optical unit 20 with the interference pattern 36 as the illuminated pattern so that the photoresist is light-exposed on the surface 14. In so doing, the optical unit 20 is moved relative to the surface 14 of the workpiece 12 in the X direction, i.e., in the longitudinal direction of the strip pattern, when the light source 22 is activated. This yields the strip-shaped light-exposed structure 40 schematically represented in FIG. 2.

The movement of the optical unit 20 relative to the workpiece 12 in the X direction is termed the movement path here. The light-exposed structure 40 generated on the surface 14 for the individual movement path comprises parallel strips that, however, are not evenly light-exposed. Due to the intensity distribution that decreases toward the edges portrayed at the bottom in FIG. 4, a varying light-exposure dose of the individual strips results within the light-exposed structure 40.

Figure 5:
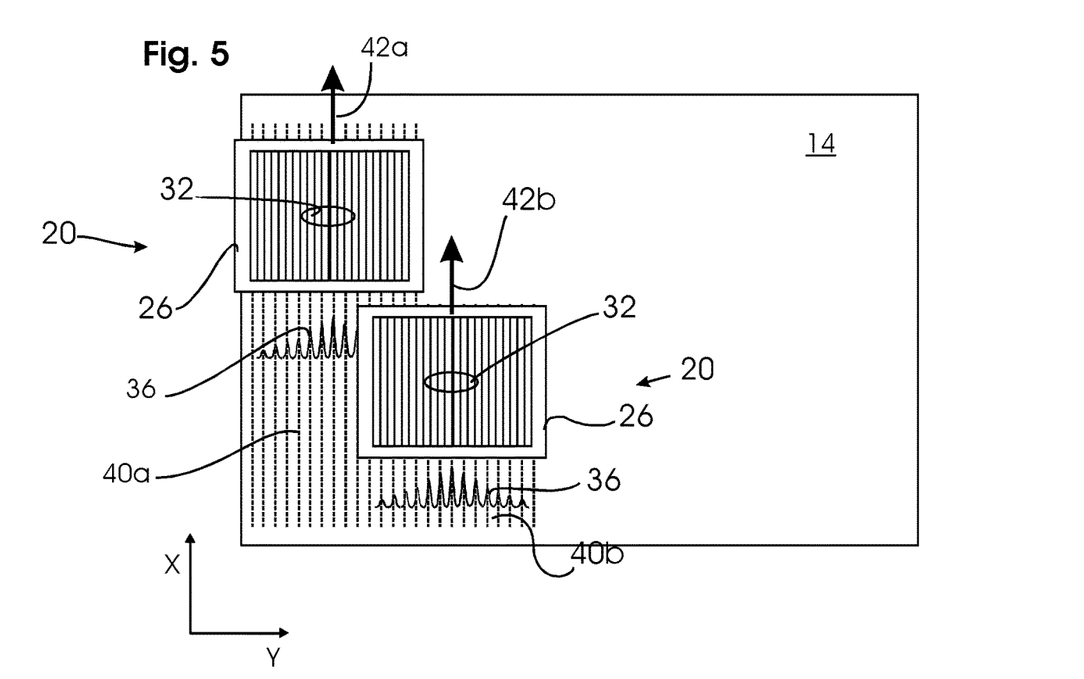
FIG. 5 shows in a schematic representation the movement of an optical unit relative to the workpiece.
Figure 6:
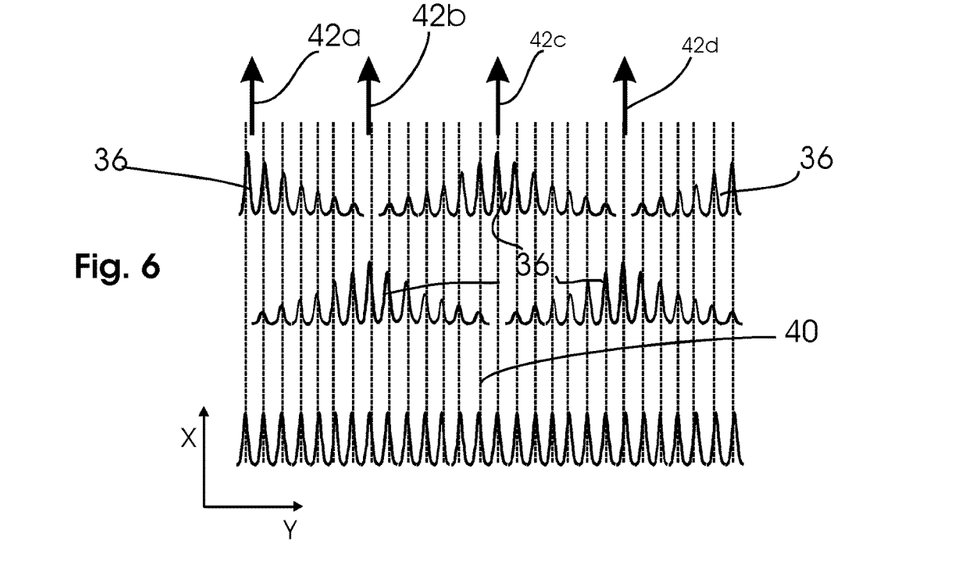
FIG. 6 shows the overlap of various light-exposed structures to a light-exposed overall structure.

In order to compensate for this, the surface 14 is traversed in several parallel movement paths 42a, 42b, 42c, 42d as portrayed in FIG. 5 and FIG. 6. The movement paths 42a to d are always arranged parallel to each other, and are offset from each other by a distance d in the Y direction. The distance d in this case is smaller than the pattern width B, which yields an overlapping of each of the generated light-exposed structures 40a, 40b.

In this case, the positioning of the optical unit 20 in the Y direction is very precise so that an in-phase overlapping is achieved in which all the maxima of the illumination pattern 36 constructively overlap, wherein the respective light-exposure dose accumulates along the strips. The offset d of the movement paths 42a to d in the Y direction corresponds as precisely as possible (with deviations of less than 20%) to an integral multiple of the pattern period so that the strips generated by the maxima 38a to d lie as precisely as possible on each other. Reference marks are used for precise positioning that for example are applied lithographically on glass rods.

The overlapping is portrayed schematically in FIG. 6. Resulting light-exposed structures 40 are generated on the surface 14 from the individual illumination patterns 36 in sequential movement paths 42a to d, in which structures the light-exposure dose has a regular structure with maxima of approximately the same level as shown on the bottom in FIG. 6.

By sequential illumination steps in which in each case a relative movement occurs between the optical unit 20 and the substrate surface 14 in the X direction along a path of travel, this can enable desired strip-shaped illumination pattern 40 to be generated on the entire surface 14.

In an exemplary embodiment, laser light from a solid-state laser is used with a wavelength of 266 nm that is formed by a suitable prism optical system 24 into an illuminated spot 32 with a width in the Y direction of 10 mm, and a width in the X direction of only 0.5 mm.

The mask 26 in the example is an amplitude grating (such as a shadow mask with a strip width that corresponds to 50% of the grating period) with a grating period of 270 nm. This has a width in the Y direction of 20 mm or more to ensure that the 10 mm wide illuminated spot does not extend to the edges.

This yields an interference pattern 36 behind the mask 26 with a pattern period corresponding to one-half of the grating period, i.e., 135 nm. On the surface 14 of the workpiece arranged at a distance of 50 µm behind the mask 26, the interference pattern 36 has a pattern width (6σ) which corresponds to the width of the illuminated spot 32 of 10 mm. In this case, the intensity of the primary maximum decreases toward the sides according to a Gaussian curve.

For example, now approximately one-third of the pattern width (which corresponds to approximately a 1σ width of the Gaussian distribution) can be selected as the offset d. In this case, the precise value d for the offset must correspond to an integral multiple of 135 nm. Then an overall even pattern results from the sequential illuminations in which the illumination dose of the maxima deviates by less than 10% from an average.

Figure 7:
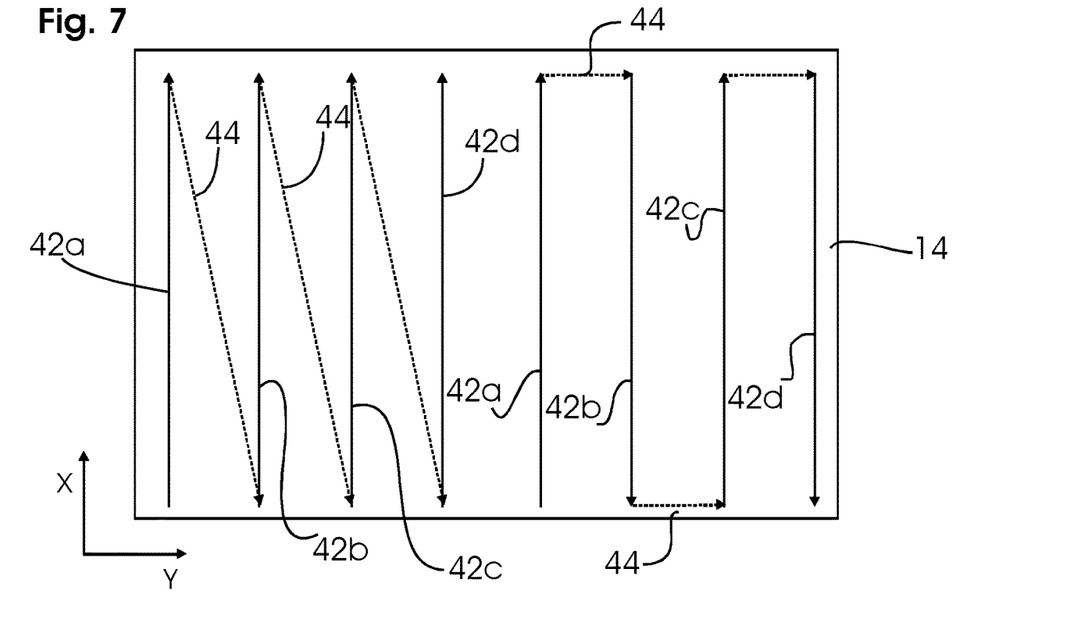
FIG. 7 shows various path sequences of an optical unit on the surface of a workpiece.

FIG. 7 portrays examples of path sequences for the movement of the optical unit 20, and accordingly portrays the illumination pattern 36 relative to the surface 14. The first path sequence shown on the left comprises parallel movement paths 42a to d that are each traversed sequentially in parallel in the same direction. Between the movement paths 42a to d, the optical unit moves along diagonal offset paths 44. In so doing, the light source 22 is deactivated by the control 30 so that there is no illumination during the offset paths 44. The offset paths 44 serve to create the desired offset d in the Y direction and to set the optical unit 20 also in the X direction at the beginning of the next movement path 42 in each case.

In the second example of a path sequence on the right side in FIG. 7, the movement paths 42 a to d each alternatingly run in the opposite direction so that the offset paths 44 arranged therebetween only extend in the Y direction.

With a corresponding path sequence, for example according to one of the two examples portrayed in FIG. 7, the entire surface 14 can be traversed and a resulting light-exposure pattern 40 can be generated on the surface 14.

FIG. 10a to 10f show examples of path sequences for various workpieces and surfaces.

Figure 11A:
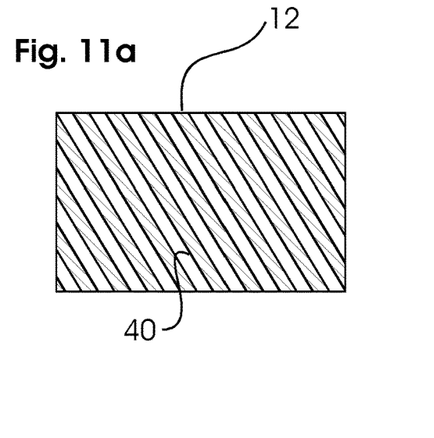
FIG. 11a-11f show the generation of different light-exposure patterns on workpiece surfaces by suitable path sequences.

For example, a strip-shaped light-exposure pattern 40 is shown in FIG. 10a on a rectangular substrate. The strips of the pattern 40 are arranged obliquely. This contour of the pattern 40 can for example be achieved by placing the workpiece 12 in the corresponding alignment on the table of the device 10 and then light-exposed according to one of the path sequences shown in FIG. 7.

Figure 11B:
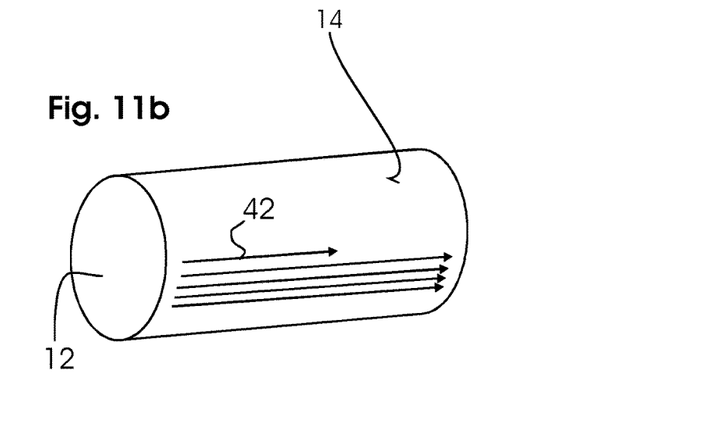
Figure 11C:
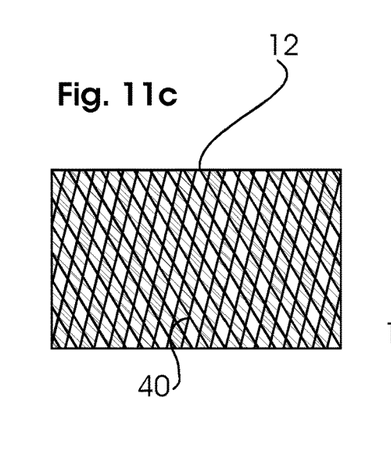

A cross-shaped pattern 40 as shown in FIG. 10c can be generated by overlapping two linear, or respectively strip-shaped patterns. In so doing, initially a first linear pattern is generated in a first orientation of the workpiece 12. Then the substrate is rotated on the table by an angle of for example 30° or 60°, and a second linear pattern is superimposed using the same procedure.

In the same way as described above with the example of a flat workpiece 12, light-exposed surface structures can be generated also for differently shaped workpieces, such as on cylindrical surfaces. Cylindrical surfaces are therefore of particular importance because print, or respectively profiled rollers can be produced therefrom for the reproduction of a pattern.

For example, FIG. 10b shows parallel movement paths 42 on the surface 14 of a cylindrical workpiece 12. For this, the device 10 from FIG. 1 is modified so that a rotatable seat is provided on the table for the cylindrical workpiece 12 so that its longitudinal axis is oriented in the X direction. In parallel movement paths 42 in the X direction, overlapping light-exposed structures are applied as described above, wherein the required offset is achieved by rotating the cylinders so that an even, strip-shaped light-exposed structure arises on the cylinder surface 14. In order to achieve a seamless structuring of the cylinder 12, it is preferable for the circumference to correspond to an integral multiple of the selected offset d in the transverse direction. It is also advantageous when the circumference is an integral multiple of the pattern period. To the extent that one of these conditions is not precisely met, adaptations can be pursued if necessary in order for the dimensions to match the preferred ideal dimensions.

Figure 11D:
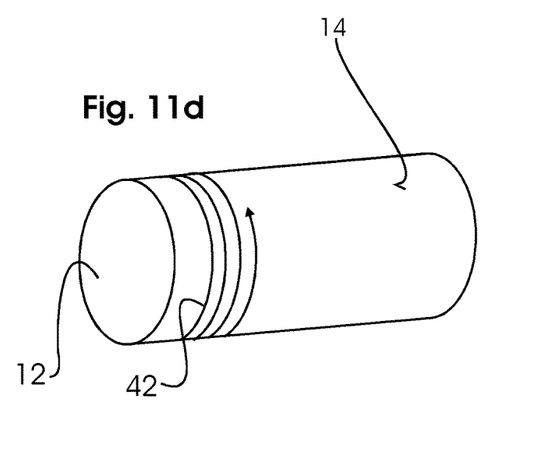

In an alternative embodiment according to FIG. 10d, the cylindrical workpiece 12 is accommodated in the device 10 with its longitudinal axis in the Y direction. In this case, there is no movement of the carriage 16 in the X direction; instead, the cylinder 12 is rotated so that circular movement paths 42 result on the surface 14. By moving the carriage 16 in the Y direction, i.e., along the longitudinal axis of the cylinder 12, overlapping light-exposed structures are superimposed to form a light-exposed overall structure in sequential parallel movement paths 42.

Figure 11E:
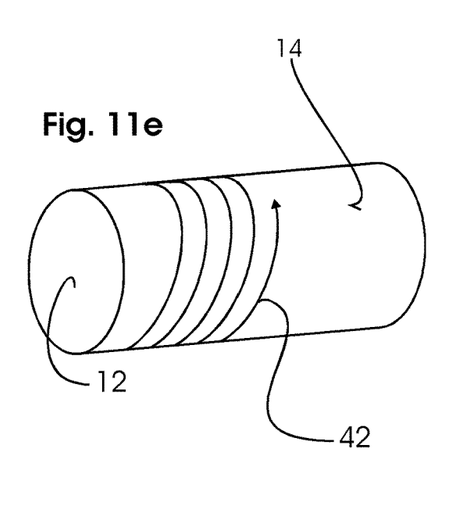

FIG. 10e shows a particularly preferred path sequence for generating a light-exposed structure on a cylindrical surface 14. In so doing, a single movement path 42 runs around the cylinder 12 as a spiral, wherein the individual windings are each arranged parallel to each other in an overlap spacing d so that a desired helical structure results. To generate this structure using a slightly modified device 10, a seating of the cylinder 12 with an orientation in the Y direction and a slight rotation of the mask 26 of the optical unit 20 are required so that the grating lines are parallel to the respective helical windings. In this case, the mask 26 can also be slightly curved corresponding to the curvature of the cylindrical surface 14. When generating the light-exposed structure, the cylinder 12 is continuously rotated about the longitudinal axis while the carriage 16 travels in the Y direction in sync with the pitch of the individual windings. The desired overlap of the individual light-exposed structures to form a regular light-exposed overall structure is thereby achieved.

Figure 11F:
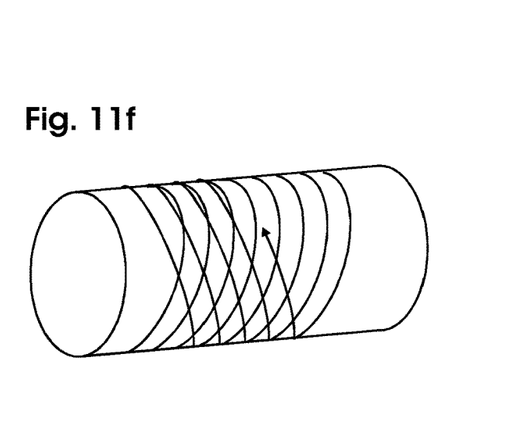

Even with a cylindrical surface, a cross-shaped structure can be achieved by repeating the aforementioned method at a different angle as represented in FIG. 10f, for example with a 30° or 60° pitch from one side, and then a 30° or 60° pitch in the opposite direction.

In the following, various embodiments of the oblique tilt of the mask 26 relative to the surface 14 are described.

Figure 8:
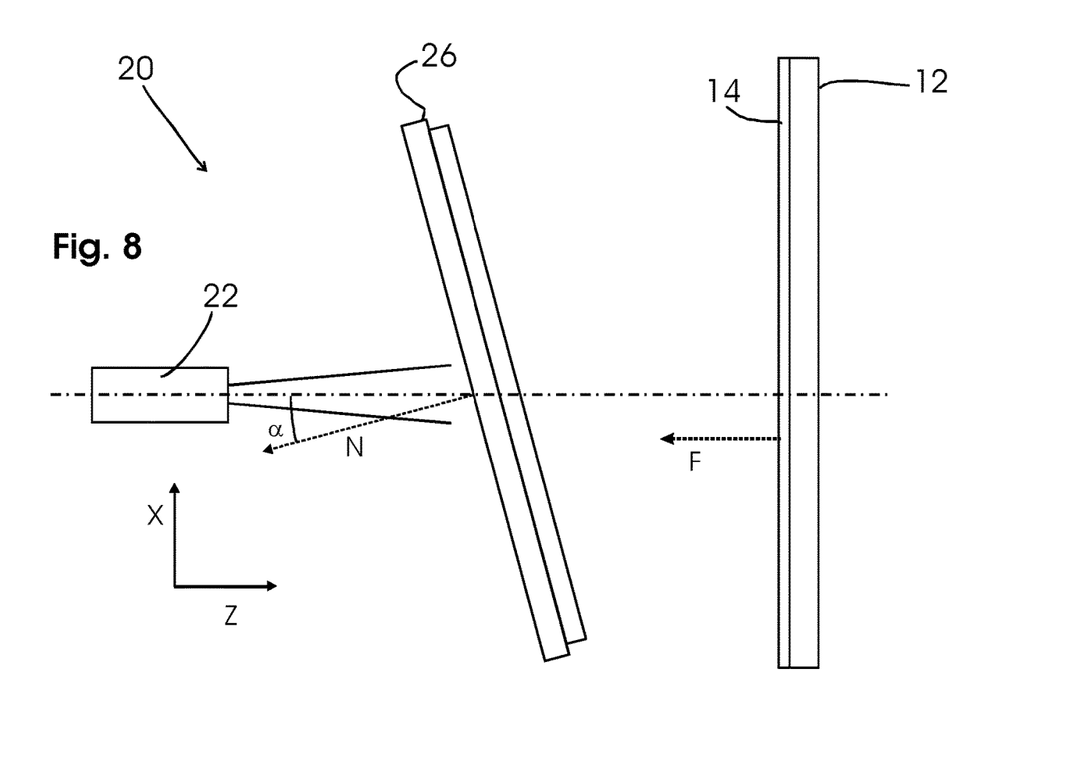
FIG. 8 shows in a schematic side view a first embodiment of an optical unit with a mask tilted relative to the light source.

FIG. 8 shows a first preferred embodiment of the optical unit 20 in which the mask 26 is slightly tilted relative to the light source 22. In this embodiment, the surface 14 of the workpiece 12 is in fact perpendicular to the optical axis, but the surface of the mask 16 is not arranged perpendicular to the optical axis of the incident light from the light source 22 and instead is arranged at a slight angle $\alpha$ thereto. The angle $\alpha$ can be measured between a normal direction N perpendicular to the surface of the mask and the optical axis established by the incident light which, in this example, is parallel to the normal direction F of the surface 14.

The mask 26 is rotated about an axis running in the Y direction, i.e., transverse to the linear grating.

Figure 4B:
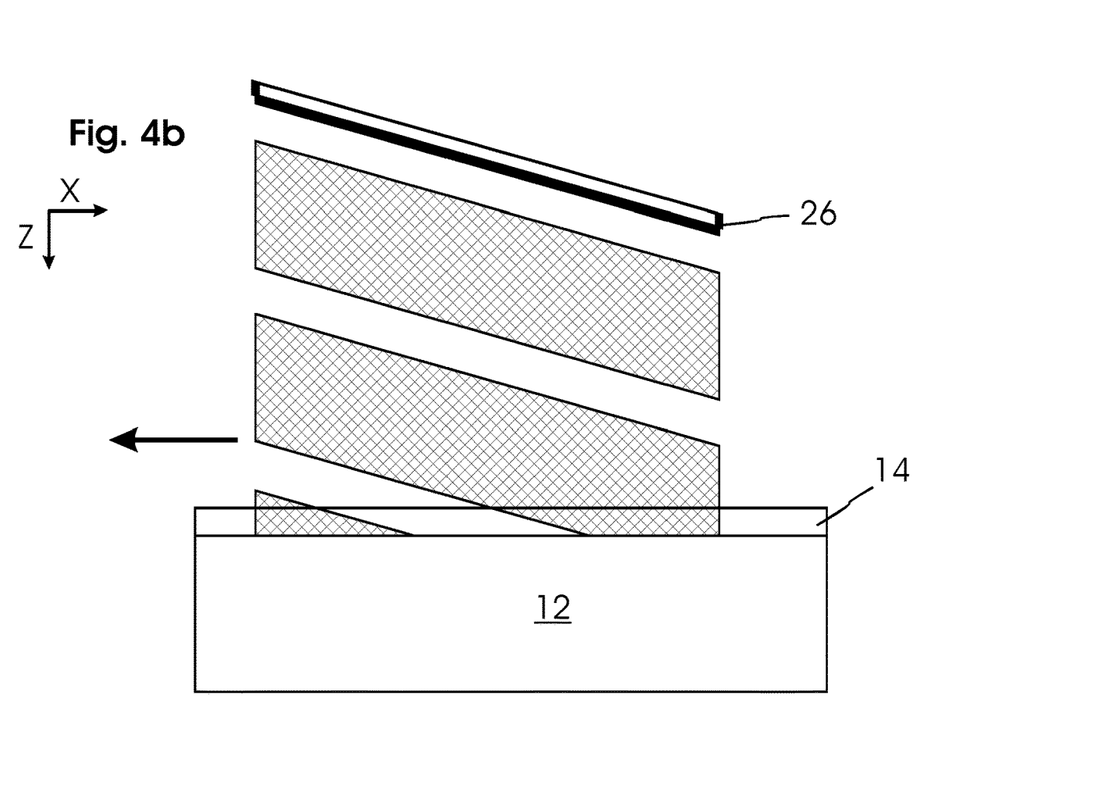
FIG. 4b shows a schematic representation of an interference pattern with an obliquely tilted mask.

FIG. 4b shows the intensity distribution resulting with an obliquely tilted mask 26. The strips running parallel to the X direction and spaced in the Z direction when the mask 26 is positioned straight run obliquely to the surface 14 when the mask is obliquely tilted. Accordingly, Talbot periods are traversed during the movement path in the X direction on the surface 14, and therefore differences in intensity of the interference field in the Z direction are compensated so that an unchanging light-exposure dose always results in the X direction.

The oblique position of the mask 26 is shown exaggerated in FIG. 8, 4b for reasons of illustration; in practical embodiments, the angle $\alpha$ is in most cases less than 2°.

Figure 9:
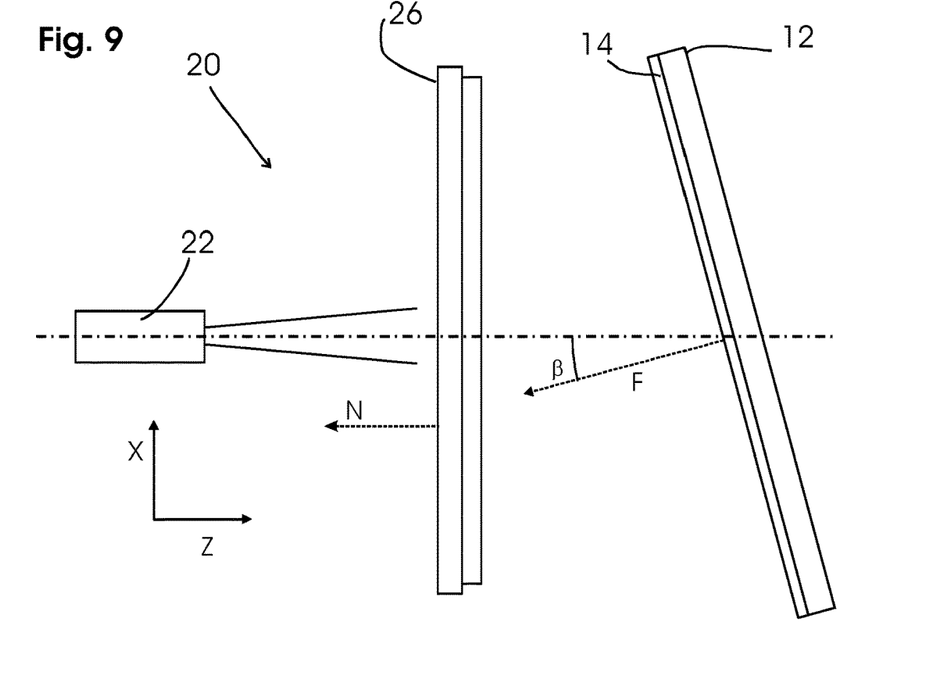
FIG. 9 shows in a schematic side view a second embodiment of an optical unit with a mask tilted relative to the surface of the workpiece.

FIG. 9 shows a second embodiment of the optical unit 20 in which the light source 22 opposite the mask 26 is in fact oriented perpendicular (the normal direction N of the mask 26 is parallel to the optical axis of the light source 22), however, the optical unit 20 overall is tilted slightly at an angle $\beta$ relative to the surface 14. The angle $\beta$ can be measured between the normal direction N, or respectively the optical axis of the light source 22 parallel thereto, and the normal direction F of the surface 14.

In this case as well, the arrangement schematically shown in FIG. 4b results in an oblique position of the Talbot carpet. In the movement in the X direction, Talbot periods are traversed, and the intensity is compensated along the X direction.

In this case as well, the oblique position of the optical unit 20 in FIG. 9 is shown exaggerated for reasons of illustration; in practical embodiments, the angle $\beta$ is however generally less than 2°.

Figure 10:
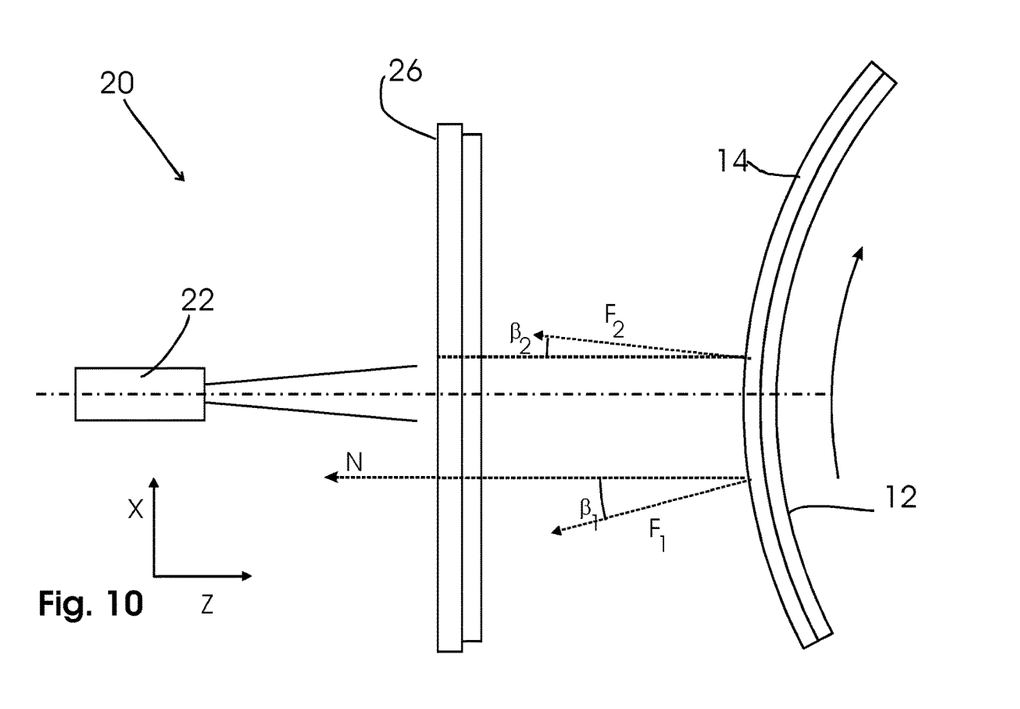
FIG. 10 shows in a schematic side view a third embodiment of an optical unit for generating an illumination pattern on a curved surface.

Finally, FIG. 10 shows a third embodiment with an arrangement of the optical unit 10 in front of the surface 14. In this embodiment, the mask 26 is oriented perpendicular to the light source 22 (normal direction N of the mask 26 parallel to the optical axis of the light source 22).

In the third embodiment, the body 12 has a curved surface 14 so that differently oriented surface normals F1, F2 result at different points on the surface 14. Given the flat extension of the illuminated spot 32 on the surface 14, oblique positions result in any case between the surface 14 and the plane of the mask 26. For example, the angles β1 and β2 are drawn here (heavily exaggerated for purposes of illustration).

For example, the body 12 can be cylindrical which is rotated as shown in FIG. 9d-9f.

Figure 4C:
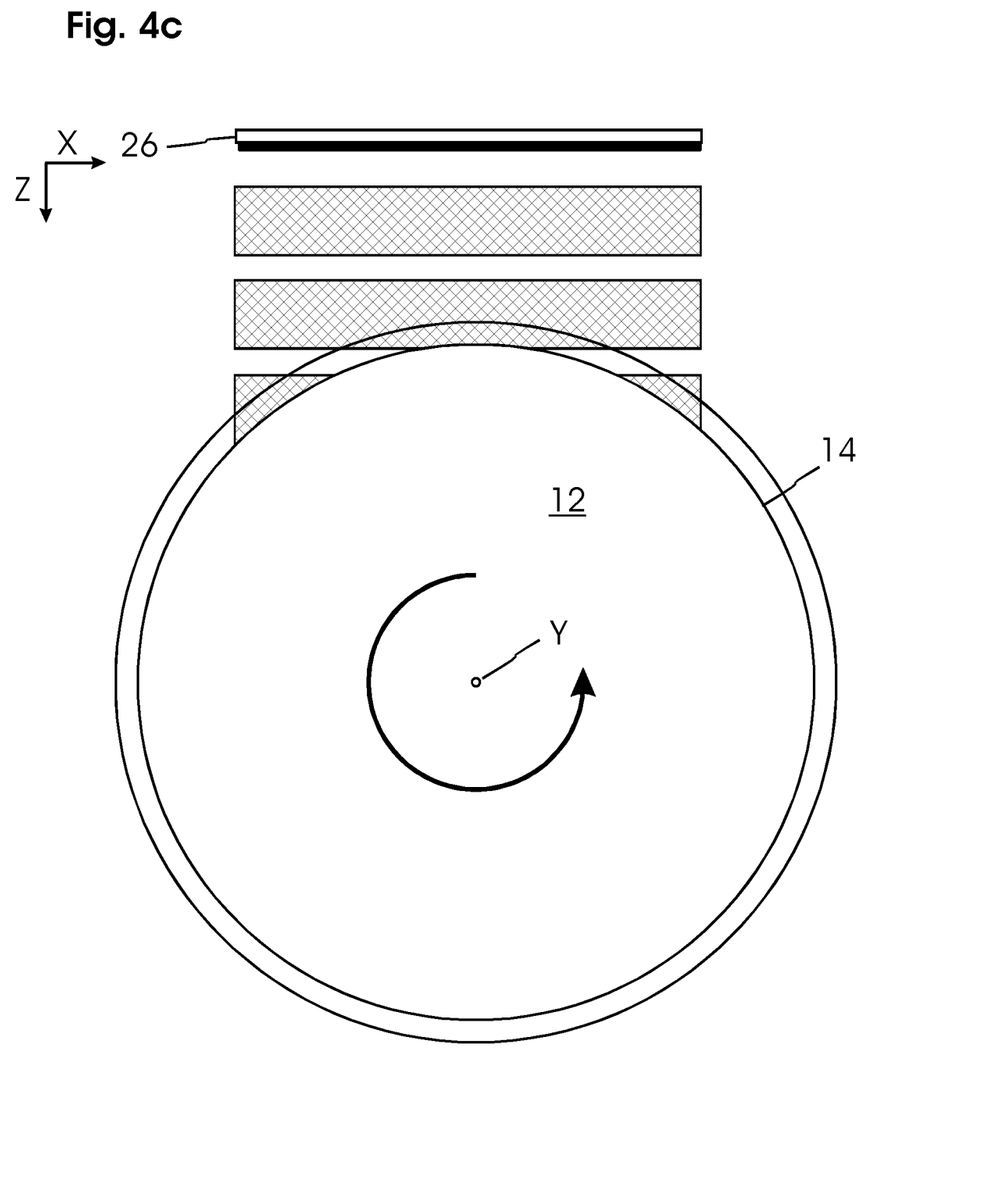
FIG. 4c shows a schematic representation of an interference pattern with a curved workpiece surface.

The conditions are schematically depicted in FIG. 4c. The Talbot periods are traversed during a rotation about the Y axis in FIG. 10 and FIG. 5c, i.e., about an axis perpendicular to the optical axis and to the longitudinal direction of the mask 26, and the desired compensation of the maxima in the Z direction results from the oblique position as well as from the different distances between the mask 26 and the surface 14 so that a sharp strip pattern results in the peripheral direction by compensating the intensities along the strips.

The presented embodiments are all examples; however, the invention is not restricted thereto. Modifications to the embodiments are always possible. For example, instead of the round illumination spot 30 on the mask 26, another shape can also be selected that for example is wider in the Y direction than in the X direction. This can be achieved by a suitable optical system 24.

Whereas in the above-described embodiments it was assumed that air is between the mask 26 and the surface 14 of the body, even finer structures can be generated by using an optically denser medium while the illumination wavelengths remain the same. This is known as immersion light-exposure which is however routine for fixed arrangements. Within the scope of a potential embodiment, the optically denser medium can for example be arranged as a sliding film, for example consisting of glycerin, between the mask and the surface. A sliding film formed from the optically denser medium can for example be applied to the surface 14 of the body.

The light then has a shorter wavelength within the optically denser medium so that structures can be generated which are finer by the factor of the relative diffraction index of the optically denser medium. For example when laser light with a wavelength of 266 nm is used, a grating of 190 nm can be used because the wavelength of the light in a medium with a diffraction index of 1.5 is only 177 nm. Accordingly, structures of 95 nm are achievable which would not be possible with the 266 nm laser light without the optically denser medium.

The invention claimed is:

1. A device for producing light-exposed structures on a workpiece having a light-sensitive surface with
   a seat for the workpiece,
   an optical unit comprising a coherent light source and a flat diffraction grating for generating a strip-shaped illumination pattern having strips extending in a longitudinal direction and having a pattern width extending in a transverse direction, said illumation pattern having an intensity distribution comprising maxima, wherein the intensity of the maxima decreases in said transverse direction from a center of the illumination pattern toward edges of the illumination pattern,
   a device for moving the surface of the workpiece and the optical unit relative to each other, wherein the device is designed to move in accordance with a path sequence,
   wherein the path sequence comprises at least a first and a second movement path in the longitudinal direction in order to generate a first and a second light-exposed structure oriented parallel to each other on the surface of the workpiece, said structures having strips,
   wherein the first and second movement path are spaced apart from each other by less than the pattern width,
   and wherein the first and second light-exposed structures overlap in such a way that strips of the first and second light-exposed structures are arranged to lie on each other, so that a resulting light-exposed structure on the surface of the workpiece has an at least substantially constant light-exposure in an overlapping region of the first and second movement path, wherein
   the diffraction grating is obliquely tilted relative to at least part of the surface of the workpiece that is light-exposed by the illumination pattern.

2. The device according to claim 1, wherein:
the diffraction grating and the light source are arranged such that the light of the light source falls on the diffraction grating at an angle to a normal direction perpendicular to the surface of the diffraction grating.

3. The device according to claim 1, wherein:
the diffraction grating and the workpiece are arranged such that a surface normal of the surface is arranged at an angle to a normal direction perpendicular to the surface of the diffraction grating, at least in part of the surface of the workpiece light-exposed by the illumination pattern.

4. The device according to claim 3, wherein:
the surface of the workpiece is curved.

5. The device according to claim 4, wherein:
the moving device comprises a device for rotating the workpiece.

6. The device according to claim 1, wherein:
a control device is provided for automatically controlling the moving device according to the path sequence.

7. The device according to claim 1, wherein:
a positioning device is provided for positioning the optical unit so that the strips of the first and second light-exposed structure are arranged lying on each other, wherein the path sequence is selected so that a light-exposed structure on the surface of the workpiece has an at least substantially constant light-exposure, at least in the overlapping region of two movement paths.

8. The device according to claim 1, wherein:
the optical unit is designed to generate a strip-shaped illumination pattern with a pattern period,
and the path sequence between two movement paths has an offset path in the longitudinal direction, wherein the device is offset transversely to the longitudinal direction by an offset section that is an integral multiple of the pattern period and less than the pattern width.

9. The device according to claim 1, wherein:
the path sequence comprises a plurality of parallel movement paths in the longitudinal direction in order to generate a light-exposed overall structure with parallel strips by parallel, overlapping light-exposed structures on the surface of the workpiece.

10. The device according to claim 1, wherein:
the optical unit comprises an optical system for generating an illumination spot on the diffraction grating, wherein the illumination spot has a shorter extension in the longitudinal direction than in a transverse direction running perpendicular thereto.

11. The device according to claim 1, wherein:
the optical unit comprises an optical system for generating an illumination spot on the diffraction grating, wherein the illumination grating has a longer extension, at least in a transverse direction running perpendicular to the longitudinal direction, than the illumination spot.

12. The device according to claim 1, wherein:
a photoresist is applied to the surface of the workpiece.

13. A method for producing light-exposed structures on a workpiece having a light-sensitive surface, wherein
a strip-shaped illumination pattern having strips extending in a longitudinal direction and having a pattern width extending in a transverse direction is generated by illuminating a flat diffraction grating with coherent light, said illumination pattern having an intensity distribution comprising maxima, wherein the intensity of the maxima decreases in said transverse direction from a center of the illumination pattern toward edges of the illumination pattern,
the illumination pattern and the surface of the workpiece are moved relative to each other according to a path sequence in order to generate at least one first and one second light-exposed structure with strips on the surface of the workpiece,
wherein the path sequence comprises at least two parallel movement paths in the longitudinal direction that are spaced apart from each other by less than the pattern width, and wherein the first and second light-exposed structures overlap in such a way that strips of the first and second light-exposed structures are arranged to lie on each other, so that a resulting light-exposed structure on the surface of the workpiece has an at least substantially constant-light exposure in an overlapping region of the first and second movement path,
wherein the diffraction grating is obliquely tilted relative to at least part of the surface of the workpiece that is light-exposed by the illumination pattern.

14. The method according to claim 13, wherein:
by overlapping at least the first and the second light-exposed structure, a first light-exposed overall structure is generated on the surface that has strips which run in a first longitudinal direction,
and wherein by a relative movement of the illumination pattern and the surface in a second longitudinal direction that has an angle relative to the first longitudinal direction, a second light-exposed overall structure is generated on the surface which crosses the first light-exposed overall structure.

* * * * *